United States Patent [19]

Watanabe

[11] 4,422,160
[45] Dec. 20, 1983

[54] MEMORY DEVICE

[75] Inventor: Hiroshi Watanabe, Tokyo, Japan

[73] Assignee: Nippon Electric Co., Ltd., Tokyo, Japan

[21] Appl. No.: 336,986

[22] Filed: Jan. 4, 1982

[30] Foreign Application Priority Data

Jan. 8, 1981 [JP] Japan ................................. 56-1684

[51] Int. Cl.$^3$ ............................................. G11C 13/00
[52] U.S. Cl. .................................. 365/189; 365/235
[58] Field of Search ...................... 365/73, 76, 77, 189, 365/190, 230, 235, 238

[56] References Cited
U.S. PATENT DOCUMENTS 4,326,270  4/1982  Owens et al. .................... 365/189

Primary Examiner—Terrell W. Fears
Attorney, Agent, or Firm—Sughrue, Mion, Zinn, Macpeak & Seas

[57] ABSTRACT

An improved memory device operable at a high speed and with a small power consumption is disclosed. The memory device comprises memory cells arrayed in rows and columns, a row decoder for selecting the rows, a column decoder for selecting columns, a shift register arranged in parallel with the column decoder, first control means for operatively enabling the shift register and second control means for suppressing the operation of the column decoder when the shift register is enabled.

7 Claims, 11 Drawing Figures

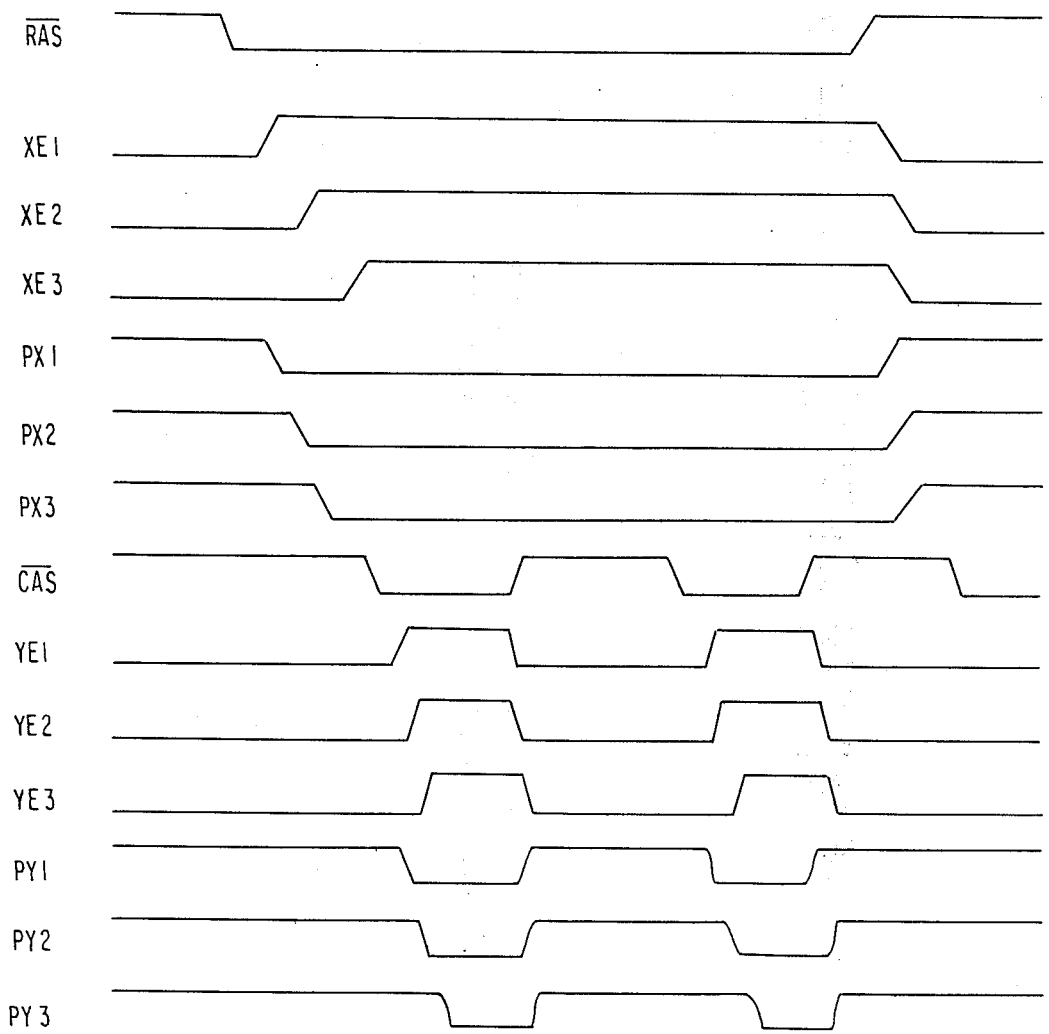

MEMORY DEVICE

The present invention relates to a memory device, and more particularly to a semiconductor memory device of the so-called multi-strobe type in which row address information and column address information are introduced through the same set of address terminals in synchronism with a row address strobe signal ($\overline{RAS}$) and a column address strobe signal ($\overline{CAS}$).

In a semiconductor memory, memory cells are arrayed in a matrix of N rows by M columns. One of the N rows is selected in accordance with row address information and one of the M columns is selected in accordance with column address information. Thus, access for read or write is executed to the memory cell located at the cross point between the selected row and the selected column. In accordance with increase in a memory capacity e.g. 64K bit or 256K bit, a number of address signals as row and column address information required to a memory becomes large. For instance, in a 64K-word × 1-bit memory, since 16 bits of address signals are necessitated, and hence a number of input terminals is increased. Therefore, a package of a memory device becomes large, and thus in practical application a mount density of mounting such memory devices in a system would be lowered. In order to obviate this shortcoming, recently a memory of the multi-strobe type has been proposed and used widely, in which address terminals are commonly used for row address signals and column address signals through a set of address terminals under control of two strobe signals called $\overline{RAS}$ and $\overline{CAS}$, respectively. In this memory, row address signals are taken in by activating $\overline{RAS}$ and thereby one row of a memory matrix is selected. Subsequently, column address signals are taken by activating $\overline{CAS}$ to select one column of the memory matrix. Thus random access is executed.

In recent years, in association with the realization of a large capacity of memories and the progress of the digital processing technique, even in the field of the art where information has been heretofore processed in the form of an analog signal such as, for example, the field of the audio or video technique also it has become marked to achieve signal processing at a high precison and/or with high flexibility under digital signal form by converting the analog signal into a digital signal. In such signal processing, digital delay processing is effected by sequentially writing a consecutive data series in a RAM and subsequently reading the data series from the RAM in the same order upon writing. In such digital delay processing a RAM is used as if it is a serial memory such as a shift register. In the following description, the operation of consecutively writing or consecutively reading such data in a predetermined sequence is called "serial access mode operation".

Heretofore, for this serial access mode, in the case where it is effected by making use of the above-described RAM of the multi-strobe type, a page mode operation of the RAM is employed. In this page mode, once random access has been executed and a $\overline{RAS}$ is kept at an activated state. Then the memory contents in all the memory cells located in the selected row are refreshed by sense amplifiers in the respective columns to be ready for being read out. While maintaining such state, only $\overline{CAS}$ is activated again to take in a column address, and the memory contents stored in the selected row are read out one column by one column. In this page mode, since a selecting operation with respect to rows becomes substantially unnecessary, high-speed access becomes possible.

However, the function of such page mode operation has not been utilized so much in a practical system in the prior art. This is because a cycle time of the page mode is at least about ⅔ times as small as a cycle time of the normal random access and hence cannot be considered as very short. Moreover, because the time required for incorporating column address information occupies a considerable part of an access time due to the fact that in a page mode it is possible to randomly access to any bit in the same row. In addition, since the column addresses to which access can be made in a page mode are limited, often the column addresses to be accessed in such a page mode are consecutive column addresses.

In view of the above-described facts, a RAM in which selection of the columns of the RAM is effected consecutively in accordance with an output of an associated shift register has been proposed. More particularly, in the proposed RAM, memory cells in a once addressed row are sequentially selected for reading out in accordance with shifted output of a shift register, and it becomes possible to shorten a cycle time by a factor of 2∼3 as compared to that of the page mode because in requential access, it is unnecessary to incorporate column address. In this RAM, a shift control signal for a shift register is generated in synchronism with a column strobe signal $\overline{CAS}$. However, in the above-described RAM, the respective functional circuits in the column system such as, for example, column decoders, column address inverter buffer circuits, etc. are also repeatedly activated and inactivated in response to the timing signal generated in synchronism with the column strobe signal $\overline{CAS}$. Hence ineffective electric power was inevitably consumed. Furthermore, the cycle period of the timing signal generated on the basis of the $\overline{CAS}$ must be adapted to such operating condition of whether activated or inactivated, and as a result it has been limited to generate a shift control signal at a high repetition frequency and achieve serial access at a high speed.

It is therefore one object of the present invention to provide a memory device which realizes high-speed serial access.

Another object of the present invention is to provide a memory device which can operate with low power consumption.

Still another object of the present invention is to provide a system for generating conrol signals for a column series functional circuit suited to a memory device having both a random access function and a sequential access function.

In a memory device according to the present invention, row address information and column address information are incorporated through the same set of address terminals in response to a row address strobe signal and a column address strobe signal, respectively and a shift register whose output is adapted to select column of a memory cell matrix is provided in addition to a column decoder. Shift operation of the shift register is effected at each time when the column strobe signal is made active level under active level state of the row address strobe signal. Here, significant feature of the present invention resides in that the column address decoder and a column address inverter are made their active states when the column address strobe signal is first made active under the active state of the row strobe signal and these states of the column address inverter and column decoder are maintained irrespectively of subsequent change of the column address strobe signal by the time point when the row strobe signal is made inactive state. While the shift register and an input/output circuit are repeatedly made active in synchronism with changes in level of the column strobe signals between its active and inactive states under the active state of the row address strobe signal. According to the present invention, without repeating active and inactive state of the column address inverter buffer and the column decoder, shift operation in the shift register and activation of the input/output circuit can be repeatedly performed at a high-speed and with a low-power consumption.

According to one aspect of the present invention, there is provided a memory device comprising a plurality of memory cells arrayed in a matrix of rows and columns, a first number of data lines a row decoder for selecting one of the rows, a first column decoder for selecting first number of the columns to be connected to the first number of the data lines, an output line, a plurality of switching means coupled between the output line and the data lines, a second column decoder for selecting one of the switching means, a shift register arranged in parallel with the second column decoder, means for receiving a first signal for enabling the row decoder, means for receiving a second signal, first control means for enabling the first and second column decoders in response to first occurrence of the second signal after the first signal occurs, and the second control means for performing shift operation of the shift register in response to the respective occurrence of the second signal after said first signal occurrs, in which contents of memory cells on the selected first number of columns are serially read-out by operating the shift register.

According to another aspect of the present invention, there is also provided a memory device comprising memory cells arrayed in rows and columns, a row decoder for selecting one of the rows, column decoder for deciding at least one of the columns to be selected, a shift register composed of a plurality of shift stages each arranged in parallel with the associated output of the column decoder, means for receiving at least one control signal, first control means for operatively enabling shift operation of the shift register in response to the control signal after the states of the row and column decoders are established, and second control means for operatively suppressing subsequent operation of the column decoder when said shift register is enabled.

The above-mentioned and other features and objects of the present invention will become more apparent by reference to the following description of preferred embodiments of the invention taken in conjunction with the accompanying drawings, in which:

FIG. 3 is a waveform diagram showing waveforms of timing signals generated by the circuit shown in FIG. 2.

Figure 4:
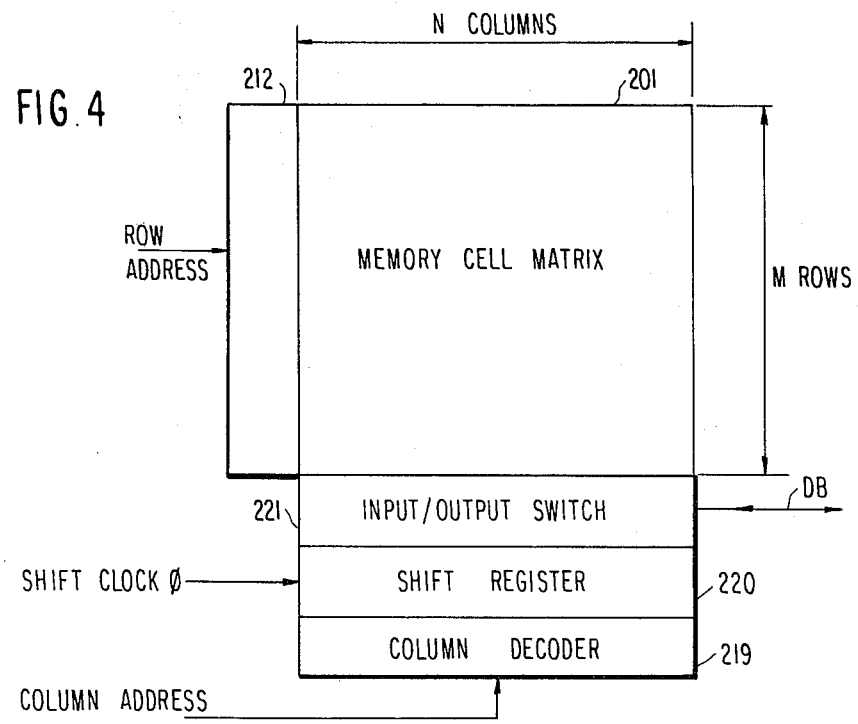
Figure 5:
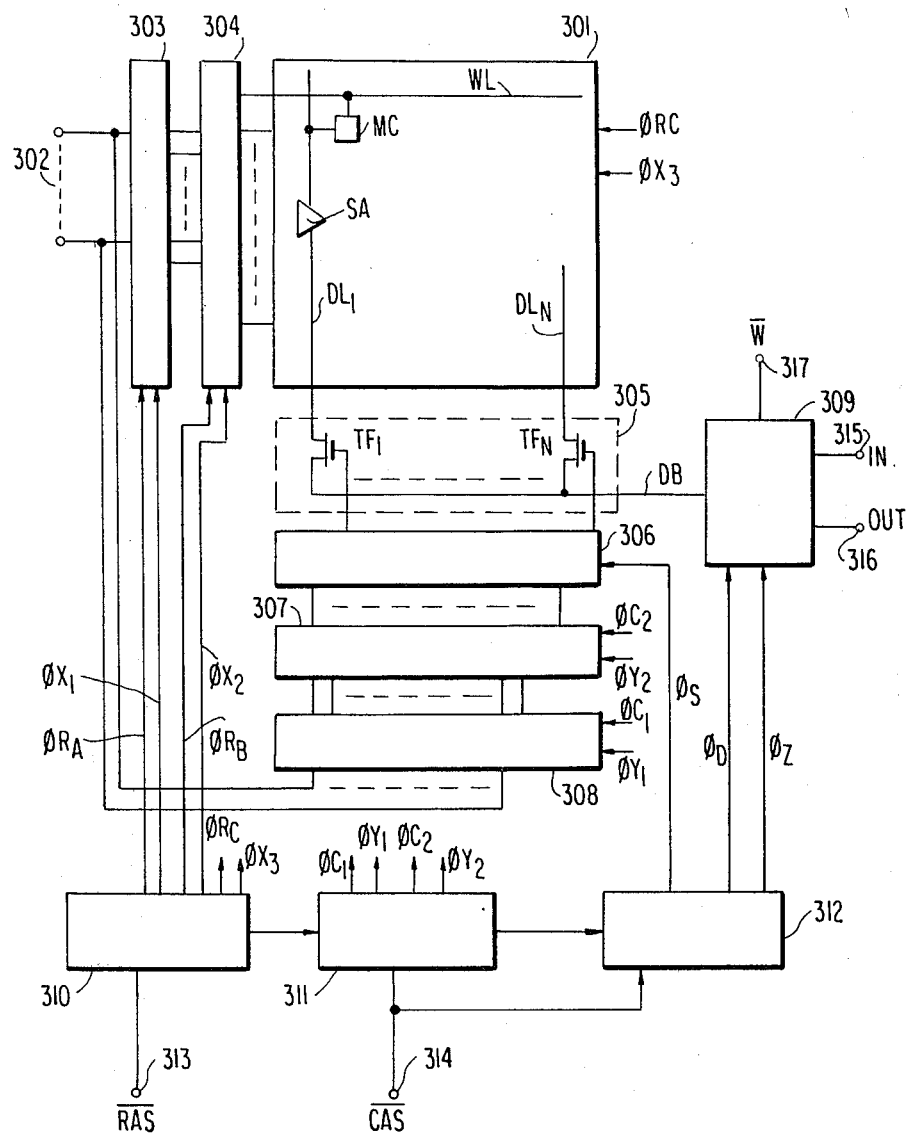
Figure 6:
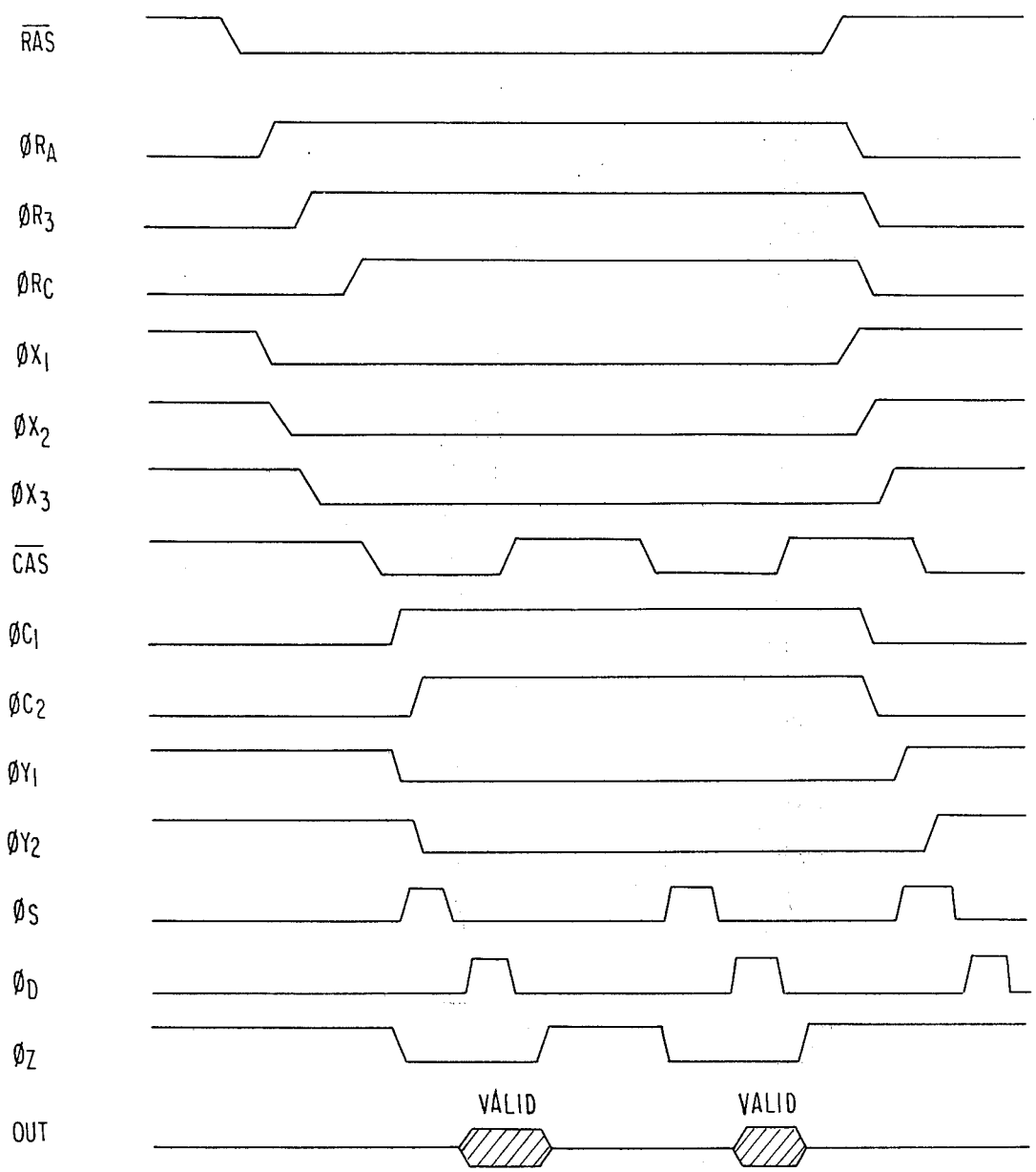
Figure 7:
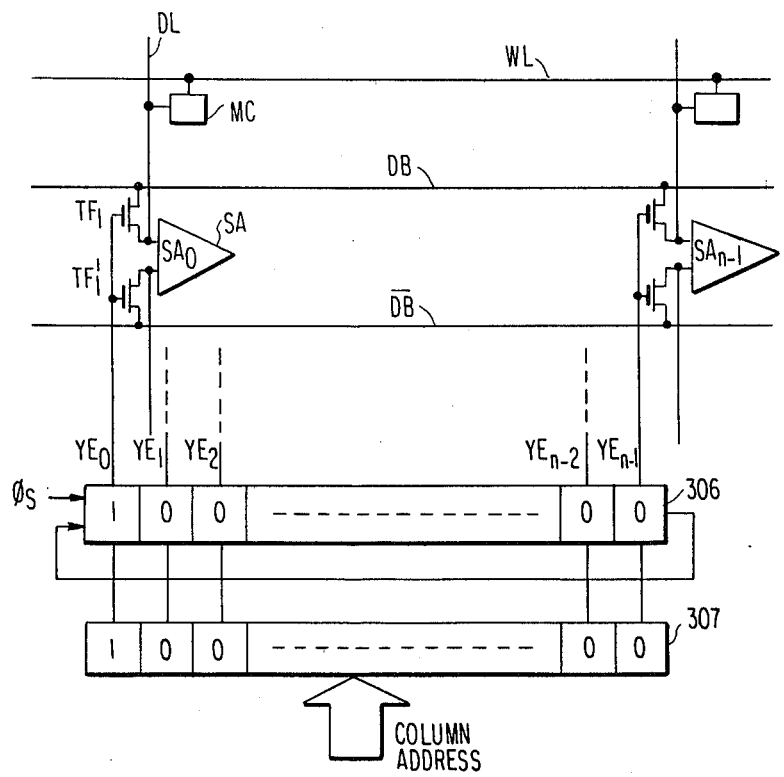
Figure 11:
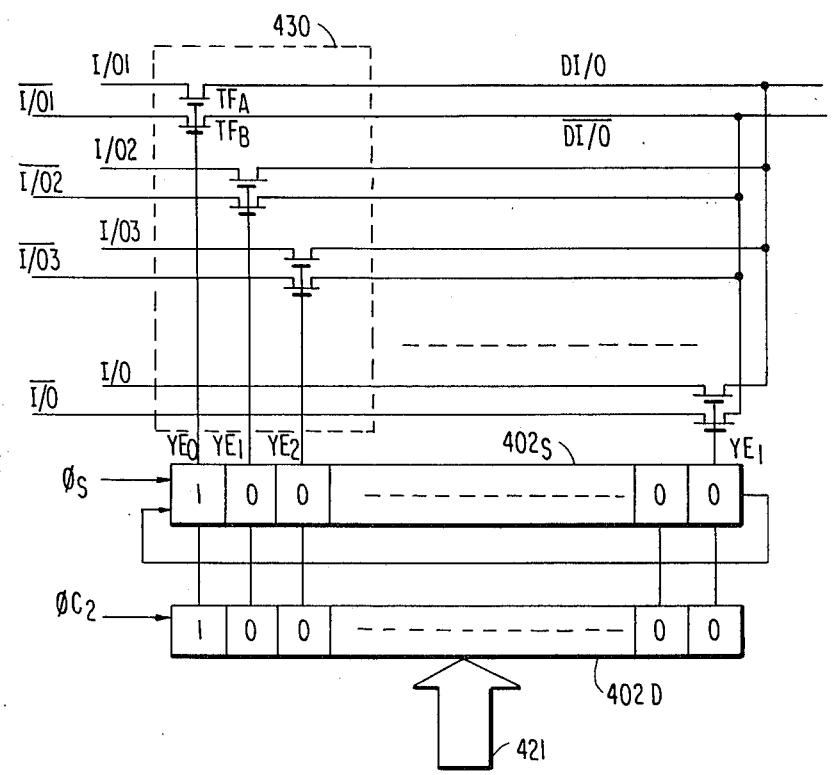
Figure 8:
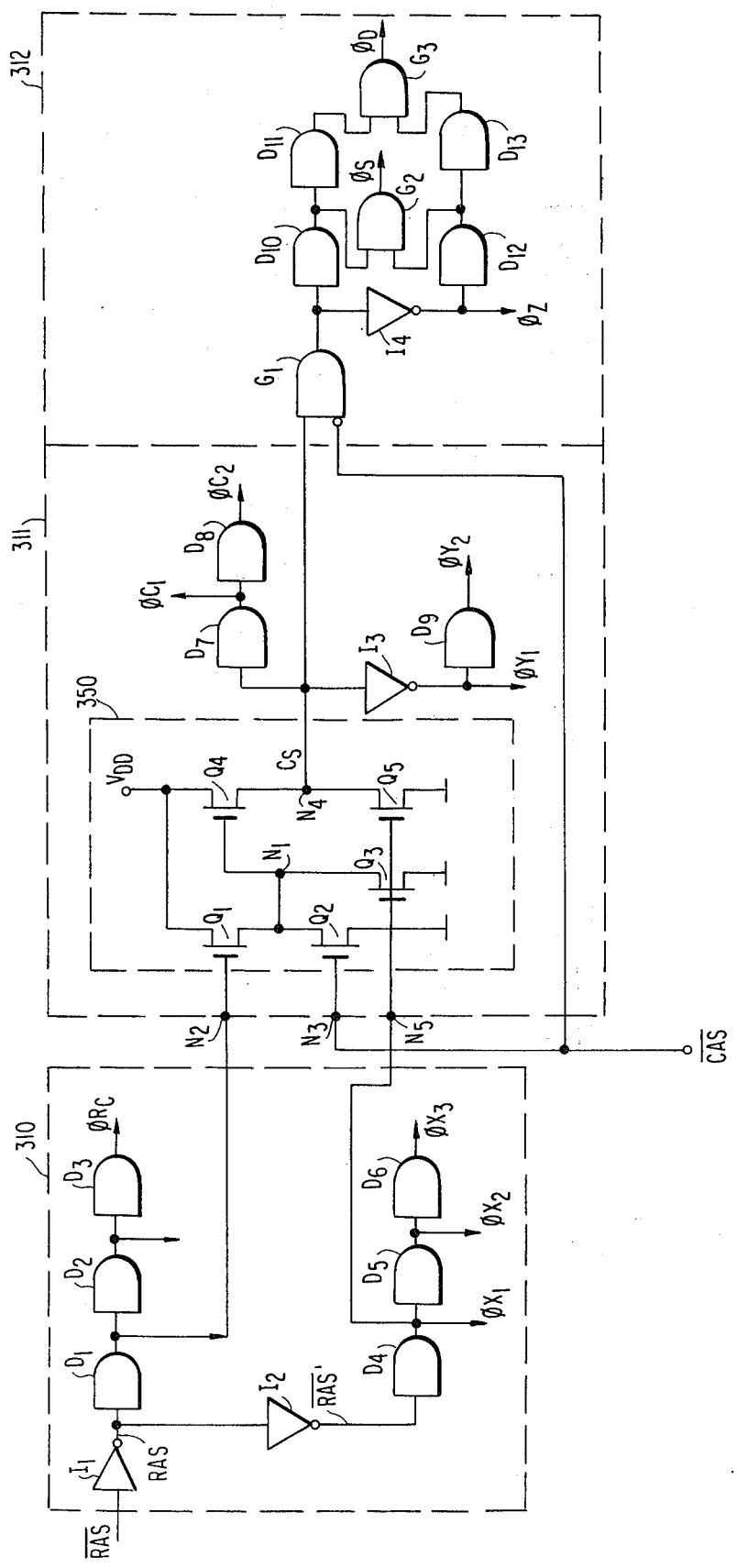
Figure 9:
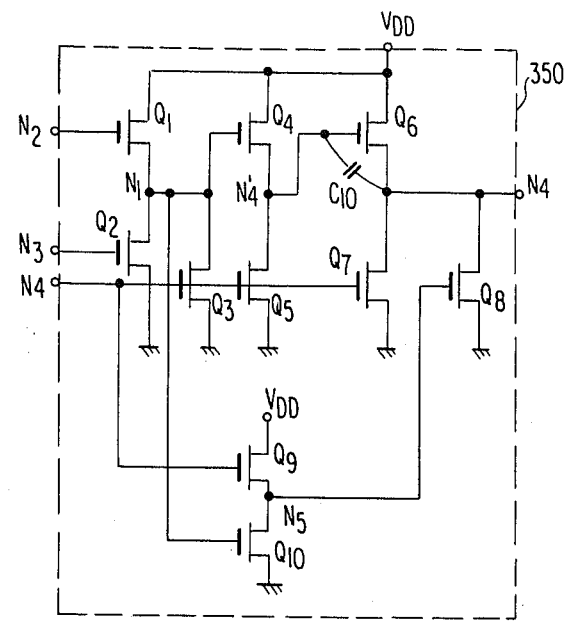
Figure 10:
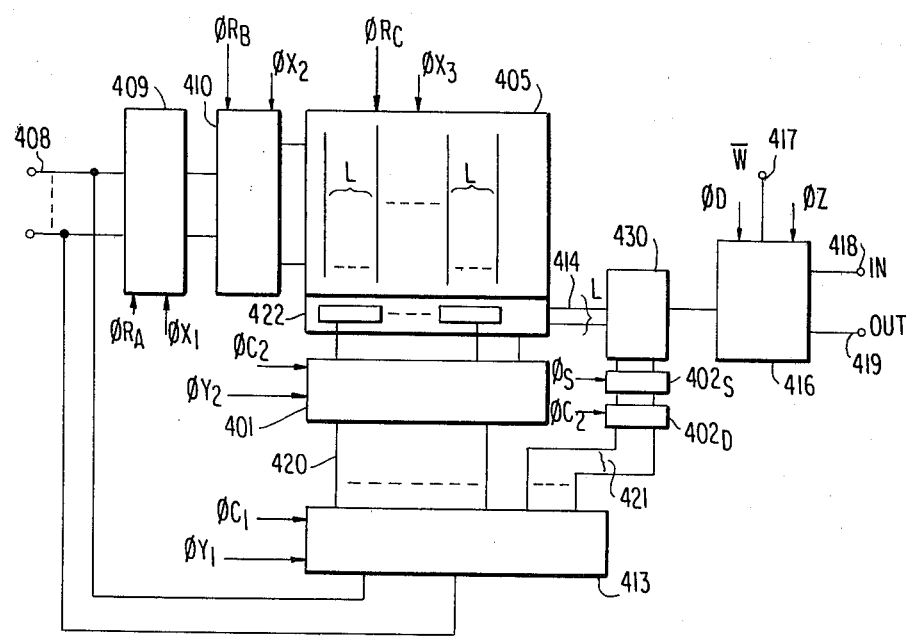

FIG. 4 is a schematic block diagram showing a basic structure of a memory device selecting to the present invention, FIG. 5 is a block diagram showing a memory device according to one preferred embodiment of the present invention, FIG. 6 is a waveform diagram showing waveforms of timing signals to be used in the memory device shown in FIG. 5, FIG. 7 is a schematic block diagram showing a column selection structure in the preferred embodiment shown in FIG. 5, FIG. 8 is a block diagram showing a structure of a timing signal generator circuit in a memory device according to the present invention, FIG. 9 is a circuit diagram showing another example of a control circuit contained in the timing signal generator circuit shown in FIG. 8, FIG. 10 is a block diagram showing a memory device according to another preferred embodiment of the present invention, and FIG. 11 is a schematic block diagram showing a column selection structure in the modified emdobiment shown in FIG. 10.

At first, description will be made on a memory device in the prior art with reference to FIGS. 1 to 3. It is to be noted that the following explanation will be made, by way of example, with respect to a dynamic memory whose circuit is constructed of N-channel MOS FET's according to the multi-strobe system in which row address information and column address information are taken in by two strobe signals $\overline{RAS}$ and $\overline{CAS}$, respectively. However, essentially there is no difference even in the case where a circuit construction making use of P-channel MOS FET's is employed or a static memory is employed.

A plurality of address input terminals 107 are coupled in common to a row address inverter buffer 111 having a latch function and column address inverter buffer 118 having a latch function. The row address inverter buffer 111 is enabled by an internal signal $XE_1$ which is generated on the basis of the $\overline{RAS}$, to latch the signals applied to the address input terminals 107 at that moment as row address signals and to apply their respective true and complementary signals to a row address decoder 112. The row address decoder 112 is enabled by a signal $XE_2$ which is generated subsequently to the signal $XE_1$ in response to activiation of the $\overline{RAS}$, to select one of M rows in memory cell matrix 101. Here it is to be noted that the $\overline{RAS}$ and the $\overline{CAS}$ are signals which are active when they are at a low level, and the memory cell matrix 101 has an M-row × N-column construction. Subsequently to the activation of the internal signal $XE_2$ caused by the activation of the $\overline{RAS}$, another internal signal $XE_3$ is activated, so that N sense amplifiers in the memory cell matrix 101 are enabled, and the contents of all the memory cells in the selected row are brought to a state ready to be read and are also refreshed.

Subsequently when the $\overline{CAS}$ is brought to an active level i.e. low level while maintaining the $\overline{RAS}$ at an activated level, i.e. a low level, then an internal column signal $YE_1$ is activated to a high level, so that the column address inverter buffer 118 latches the signals applied to the address input terminals 107 at that moment as column address signals and applies their respective true and complementary signals to a column address decoder 119. The column address decoder 119 is enabled by an internal column signal $YE_2$ which is generated subsequently to the signal $YE_1$ in response to the activation of the $\overline{CAS}$, to drive a column selection circuit 121. The column selection circuit 121 transmit data of a selected column among the N columns to an input/output circuit 120. The input/output circuit 120 has read/write selection signal $\overline{W}$ applied to its terminal 104, and it is assumed here that at this moment the read/write selection signal is at a high level indicating a read mode. Consequently, when the input/output circuit 120 is enabled by another internal column signal $YE_3$, read data is output through an output terminal 106. The above-mentioned is a basic operation for random access.

Next, while the read data in all the memory cells in the selected row designated by the above-described random access are maintained by holding the $\overline{RAS}$ at a low level, the $\overline{CAS}$ is once reset at a high level. In response to the reset of the $\overline{CAS}$, column reset signals $PY_1 \sim PY_3$ for resetting the circuits 118~120. Then as the $\overline{CAS}$ is made at a low level, the column reset signals are made inactive. Then, a column address that is different from that introduced upon the above-described random access is introduced through the input terminals 107 and by successively enabling the column address inverter buffer 118, column address decoder 119, column selection circuit 121 and input/output circuit 120, by activating the internal column signals $YE_1 \sim YE_3$, respectively. Thus, data in the memory cell at the different column address in the previously selected row is read out. As described above, by repeating activation and inactivation of the $\overline{CAS}$ only while maintaining the $\overline{RAS}$ at the activation level, any one of the memory cells belonging to the row selected upon activation of the $\overline{RAS}$ can be read out under control of the $\overline{CAS}$ only. Finally, the $\overline{RAS}$ is turned to the inactive level, i.e. a high level, row reset signals $PX_1 \sim PX_3$ are generated for resetting the circuits 111, 112 and 101. Such read operation is called "page mode operation".

Figure 1:
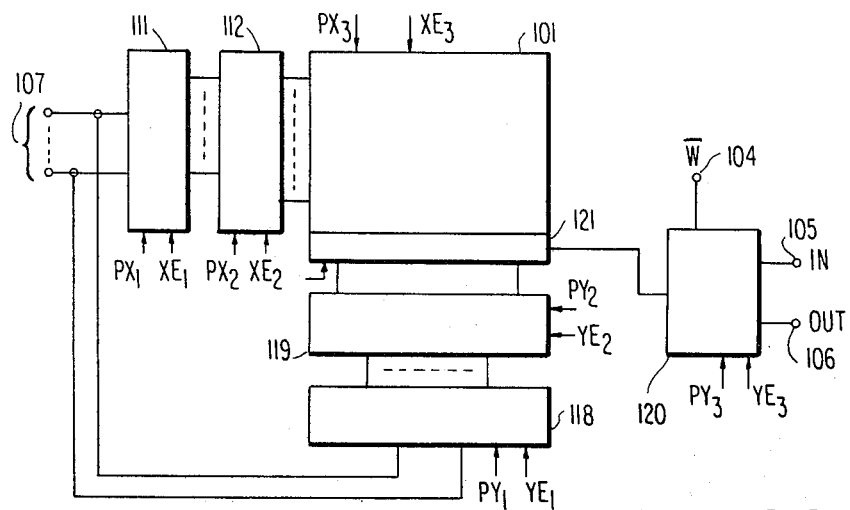
FIG. 1 is a block diagram showing a memory device in the prior art.
Figure 2:
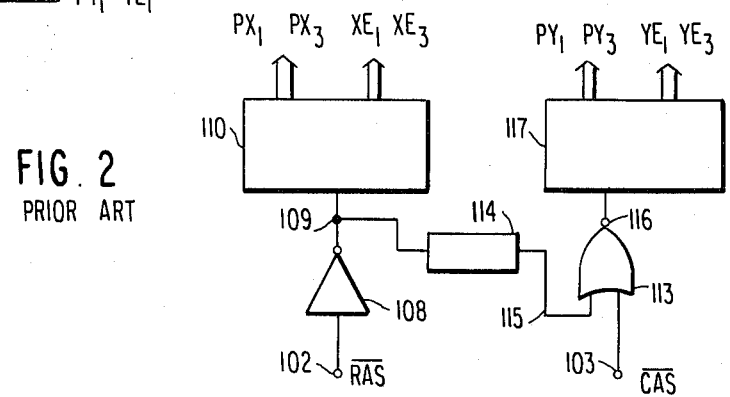
FIG. 2 is a block diagram showing a timing signal generator circuit in a memory device in the prior art.

A control signal generator circuit for generating the respective internal signals, that is, control signals to be used in the memory device in FIG. 1, is illustrated in FIG. 2, and the waveforms of the respective output signals from the circuit are illustrated in FIG. 3. In FIG. 2, the $\overline{RAS}$ is applied to a terminal 102 to be led to an input of an inverter 108. The output 109 of the inverter 108 is applied to a row timing circuit 110. The row timing circuit 110 responds only to the $\overline{RAS}$, and when the $\overline{RAS}$ is turned to a low level, an output signal 109 of the inverter 108 takes a high level to successively generate activation signals $XE_1 \sim XE_3$ through delay processing. When the $\overline{RAS}$ is turned to a high level, the signals $XE_1 \sim XE_3$ are inactivated, and in place therefor, reset precharge signals $PX_1 \sim PX_3$ are generated to reset the row address inverter buffer 111, row address decoder 112 and memory cell matrix 101.

A column timing circuit 117 is driven by an output signal 116 of a NOR gate 113. To one input terminal 103 of the NOR gate 113 is applied the $\overline{CAS}$, while to the other input 115 of the NOR gate 113 is applied a signal obtained by passing the output 109 of the invertor 108 through a delay inverter circuit 114. Accordingly, a predetermined period after the $\overline{RAS}$ was turned to a low level, an input terminal 115 of the NOR gate takes a low level. Hence, after this time point, when the $\overline{CAS}$ is turned to a low level, the output of the NOR gate 116 is turned to a high level. Thereby the column timing circuit 117 is enabled and the activation signals $YE_1 \sim YE_3$ are successively generated. When the $\overline{CAS}$ changes from a low level to a high level, the output 116 of the NOR gate 113 is turned to a low level, and in response thereto reset precharge signals $PY_1 \sim PY_3$ for executing reset of the column address inverter buffer 118, column address decoder 119, column selection circuit 121 and input/output circuit 120.

As described above, in the page mode operation of the memory device in the prior art, it was possible to make access to different column addresses in the same row by repeating activation and reset of the $\overline{CAS}$ while maintaining the $\overline{RAS}$ at its active level. However, since the respective column series function circuits 118~121 must be enabled and reset each time by repeating activation and reset of the $\overline{CAS}$ and since column addresses must be taken in through the input terminals for each read-out operation, the high-speed access operation of the page mode operation was necessarily limited.

Now a basic structure of a memory device relating to the present invention will be described with reference to FIG. 4. In this figure, a memory cell matrix 201 has an M-row × N-column construction, and it also includes N sense amplifiers belonging to the respective columns. In this structure, an input/output switch circuit 221 is controlled by an output of a shift register 220 so that a selected column in the memory cell matrix 201 may be coupled to a data bus DB to effect transmission of data therebetween. This shift register 220 has parallel outputs equal in number to or more than the columns of the memory cell matrix 201 and there respective outputs are coupled to the input/output switch circuit 221. In this shift register 220, an initial selection address is determined by a column decoder 219. More particularly, in the initial random access operation, at first a row address taken in by turning the $\overline{RAS}$ to a low level is applied to a row decoder 212, so that one of the M-rows can be selected, and subsequently, a column address taken in by turning the $\overline{CAS}$ to a low (active) level is applied to the column decoder 219. Then this column decoder 219 activates one of the parallel outputs of the shift register 220. Thereafter, by resetting the $\overline{CAS}$ and then again turning it to a low level while maintaining the $\overline{RAS}$ at a low (active) level, the operation of the memory device is transferred to a serial access mode. Each time the $\overline{CAS}$ is turned from a low (active) level to a high level, a shift clock for shifting the contents of the shift register 220 by one bit. For the access to a memory cell in this serial access mode of operation, column address information which was heretofore taken in by means of a column address inverter buffer, is not necessitated. Therefore, consecutive address can be accessed at a high speed without incorporating column address signals. In addition, in the case that the generation of the shift clock when the $\overline{CAS}$ is at a high (inactive) level, that is, during the reset period is effected on the assumption that in the next cycle the next column address is always accessed, transfer of column selection information to the next adjacent column address is completed during the reset period of the $\overline{CAS}$. Hence as soon as it enters the next subsequent activation period of the $\overline{CAS}$ the data read from the selected data is output externally, and therefore, the high-speed characteristics of the serial access mode can be further enhanced.

However, if such serial access mode of operation is carried out according to the timing signals generated from the circuit shown in FIG. 2 in response to the $\overline{RAS}$ and the $\overline{CAS}$ in the prior art, especially according to the timing signals generated in response to the $\overline{CAS}$ when the $\overline{RAS}$ is held at a low level, then the column decoder 219 and the column address inverter buffer also would repeat useless activation and reset operations in accordance with the shift operations of the shift register 220. This would not only result in ineffective consumption of electric power due to repeated activation and inactivation, but also become a cause for preventing speed-up of the operation because the repetition frequency of the shift clock is limited to a low value due to the cycle period of such activation and inactivation.

Now one preferred embodiment of the present invention will be described with reference to FIGS. 5 and 6. In FIG. 5, a memory cell matrix 301 has an N-row × M-column construction in which memory cells MC are disposed at the respective cross-points between M word lines (WL) and N digit lines ($DL_1 \sim DL_N$). In this structure, a shift register 306 having N bit shift length is provided between a column decoder 307 and a column selection circuit 305. A sense amplifier SA is provided in each column. A row series timing signal generator 310 for generating activation signals $\phi R_A$, $\phi R_B$ and $\phi R_C$ and reset signals $\phi X_1$ to $\phi X_3$ for a row address inverter buffer 303, row address decoder 304 and the memory cell matrix 301 in the similar manner to the prior art technique. Namely, the activation signals $\phi R_A$, $\phi R_B$ and $\phi R_C$ are sequentially generated in response to the active level (low level) of the $\overline{RAS}$. While the reset signals $\phi X_1$ to $\phi X_3$ are sequentially generated in response to the inactive (high) level of the $\overline{RAS}$. In this invention, control signals for the column series function circuits, i.e. a column address inverter buffer 308, the column address decoder 307, the shift register 306 and an input/output circuit 309 are generated by two independent first and second column series timing signal generators 311 and 312. The first column series timing circuit 311 generates activation signals $\phi C_1$ and $\phi C_2$ for enabling the column address inverter buffer 308 and the column decoder 307 respectively in response the activation of the $\overline{CAS}$ during the activation of the $\overline{RAS}$ and then maintain the signals $\phi C_1$ and $\phi C_2$ irrespectively of the state of the $\overline{CAS}$ till the $\overline{RAS}$ is made inactive (high) level. When $\overline{RAS}$ is turned to the inactive level, the signals $\phi C_1$ and $\phi C_2$ are made low level and then the reset signals $\phi Y_1$ and $\phi Y_2$ for resetting the column address inverter 308 and 307, respectively. It should be noted that the operation of the first column series timing circuit 311 is completely different from that of the conventional circuit 117 of FIG. 2 in which the activation signals $YE_1$ to $YE_3$ and the reset signals $PY_1$ to $PY_3$ are repetitiously generated in synchronism with the active and inactive level of the $\overline{CAS}$ during the active period of the $\overline{RAS}$. Therefore, the column address inverter 308 and the column decoder 307 are enabled only one time during the serial access mode introduced by repetitiously making the $\overline{CAS}$ active during the active period of the $\overline{RAS}$.

The second column series timing circuit 312 generates a shift signal $\phi_S$ for the shift register 306 and an activation signal $\phi_D$ for the input/output circuit 309 in response to the respective activation (low level) of the $\overline{CAS}$ during the active period of the $\overline{RAS}$. Namely, the signals $\phi_S$ and $\phi_D$ are generated at each time when the $\overline{CAS}$ is turned to the active level under the active level of the $\overline{RAS}$. A reset signal $\phi_Z$ for resetting the input/output circuit 309 is generated by the second column series timing circuit 312 at each time when the $\overline{CAS}$ is turned to the inactive (high) level during the active period of the $\overline{RAS}$.

With reference to FIG. 6, operation of the memory shown in FIG. 5 will be described.

The row address inverter buffer 303 is enabled by the signal $\phi R_A$ issued from the row series timing signal generator circuit 310 in response to activation of the $\overline{RAS}$ and upon activation it latches address signals received through address input terminals 302 and applies their respective true and complementary signals of the address signal to a row address decoder 304. The row address decoder 304 is enabled by the signal $\phi R_B$ so as to select one of the M rows. Then, the respective sense amplifiers SA in the memory cell matrix 301 achieve amplification operations in response to the signal $\phi R_A$ and data amplified thereby are fed back to the respective digit lines $DL_1 \sim DL_N$. The above-mentioned is the operations achieved in response to the activations signals $\phi R_A$, $\phi R_B$ and $\phi R_C$ generated by the timing signal generator circuit 310 in response to the activation of the $\overline{RAS}$.

The column address inverter buffer 308 is enabled by the signal $\phi C_1$ issued from the first column series timing circuit 311 in response to activation of the $\overline{CAS}$ following the $\overline{RAS}$, and upon activation it laches an address signal received through the address input terminals 302 as column address signals and applies true and complementary signals for the address signals to the column address decoder 307. The column address decoder 307 is enabled by the signal $\phi C_2$ following the signal $\phi C_1$ issued from the first column series timing signal generator circuit 311 so as to bring one of its N outputs to a selection level. In accordance with the output state of this column address decoder 307, the shift register 306 having a shift length of N bits with the outputs of the respective bits applied to corresponding gates of N transfer-gate transistors $TF_1 \sim TF_N$ in the column selection circuit 301, is set at its initial state such as, for example, the state where only the first bit transfer-gate transistor $TF_1$ is conducting. Read data selected by the column selection circuit 305 is passed to the input/output circuit 309 through the column selection circuit 305 and the data bus DB. If the read/write selection signal $\overline{W}$ is at a high level, then the input/output circuit 309 is set in a read mode, in which in response to the signal $\phi_D$ issued from a second column series timing signal generator circuit 312 it amplifies the read data and outputs the amplified read data through an output terminal 316.

Subsequently, the CAS is reset at a high level while maintaining the $\overline{RAS}$ at a low level. Here it is to be noted that during this period the respective signals $\phi R_A \sim \phi R_C$, $\phi C_1$ and $\phi_2$ issued from the row series timing signal generator circuit 310 and the first column series timing signal generator 311, especially the timing signals $\phi C_1$ and $\phi C_2$ would not be reset as maintained at an activation level. The second column series timing signal generator circuit 312 is reset in accordance with the reset of the $\overline{CAS}$, and then applies the precharge signal $\phi_Z$ to the input/output circuit 309 to bring the circuit 309 into a reset precharge state. Subsequently in response to the $\overline{CAS}$ being brought into an active state at a low level, the shift signal $\phi_S$ is generated by the second column series timing circuit 312, so that the shift register 306 shift the position of the selection level designated previously by the column address decoder 307 by one bit to the next adjacent bit position (for instance, from the position $TF_1$ to the position $TF_2$). Accordingly, on the data bus DB would appear the read data at the next adjacent column address. Subsequently, the signal $\phi_D$ is generated and the input/output circuit 309 outputs the new read data through the output terminal 316.

As described above, read of data at different column addresses in the same row can be achieved consecutively as repeating shift in the shift register 306 and activation and reset (or inactivation) of the input/output circuit 309, by repeating reset and activation of the $\overline{CAS}$ while maintaining the $\overline{RAS}$ activated. During this period, since the column address decoder 307 and the column address inverter buffer 308 never repeat reset and activation at all, these component parts would not prevent the serial access mode operation at all. This state is maintained until the $\overline{RAS}$ is brought to a high level. When the $\overline{RAS}$ is turned to a high level, all the circuit components are brought to a reset state by reset precharge signals $\phi X_1 \sim \phi X_3$, $\phi Y_1$, $\phi Y_2$ and $\phi_Z$ The above-mentioned operations will be readily understood by reference to the waveforms of the timing signals illustrated in FIG. 6.

Now, one practical circuit construction for access to the column address in the preferred embodiment shown in FIG. 5, will be explained in greater detail with reference to FIG. 7. In this figure, each data bus is formed of a pair of true and complementary data buses DB and $\overline{DB}$, and the transfer gate is each column is also formed of a pair of transfer-gate transistors $TF_1$ and $TF'_1$. In synchronism with falling of the $\overline{RAS}$ clock, a column address signal is latched. When a row address inverter buffer operated, an address binary code is produced. This coded signal is applied to a row address decoder so as to select one of M decoder outputs in the conventional manner. One word line is selected by the selection operation of the row address decoder, hence memory cells connected to that word line are selected. Then information stored in the selected memory cells is transmitted to sense amplifiers $SA_0 \sim SA_{N-1}$ and amplified thereby. Thereafter, upon falling of the $\overline{CAS}$, a column address signal is latched, then a series of operations occur successively in a column address inverter buffer and the column address decoder 307, and among the N bits of the memory cell information selected by the row address decoder, only one bit selected by the column address decoder 307 is transferred to input/output data buses DB and $\overline{DB}$ via transfer-gate transistors $TF_1$ and $TF_{1'}$. Normally, a selection state of a decoder is defined such that a selected decoder section for a memory circuit takes high level (logic level "1"), while an unselected decoder section for a memory circuit takes a low level (logic level "0"). Therefore, when the column address decoder 307 determines its selection state, in an N-bit decoder, only one bit section is in the state of "1" and all the remaining decoder sections are in the state of "0". This state of the column address decoder 307 is taken in and held by the shift register 306 in the first RAS/CAS cycle. Thereafter, when the operation transfers to a serial access mode, the shift clock $\phi_S$ synchronized with the $\overline{CAS}$ is generated, and subsequently the shift register 306 starts transfer (or shift) of data one bit by one bit. Consequently, since the function of selection or unselection of the column address decoder 307 is determined only by the data held in the shift register 306, the operations of the column address inverter buffer and the like can be omitted provided that only the timing of data transfer determined by the shift clock $\phi_S$ is carefully checked. Hence, the above-described memory device according to the present invention can achieve remarkable effects for shortening an access time.

Next, description will be made on a detailed construction of the timing circuits 310~312 which are very significant for the present invention, with reference to FIG. 8. In the row series timing circuit 310, an inverted signal RAS' for the $\overline{RAS}$ is generated by an inverter $I_1$, and the respective activation signals $\phi R_A \sim \phi R_C$ are generated by passing this inverted RAS' signal successively through delay buffers $D_1 \sim D_3$. On the other hand, the output signal RAS' of the $\overline{RAS'}$ inverter $I_1$ is further inverted by another inverter $I_2$ and thereafter the further inverted signal is passed through delay buffers $D_4 \sim D_6$ successively to generate the reset precharge signals $\phi X_1 \sim \phi X_3$.

The first column series timing circuit 311 includes a signal control circuit 350. In this timing circuit 311, an output signal derived at an output node $N_4$ of the signal control circuit 350 is passed successively through delay buffers $D_7$ and $D_8$ to generate the signals $\phi C_1$ and $\phi C_2$. Also the signal $\phi Y_1$ is generated by inverting the output signal at the output node $N_4$ through another inverter $I_3$, and further the signal $\phi Y_2$ is generated by passing the inverted signal through another delay buffer $D_9$. The signal control circuit 350 comprises N-channel enhancement MOS FET's $Q_1 \sim Q_5$. The FET's $Q_1$ and $Q_2$ form a series circuit between a power supply $V_{DD}$ and the ground, and likewise the FET's $Q_4$ and $Q_5$ also form a series circuit between the power supply $V_{DD}$ and the ground. A common junction between the FET's $Q_1$ and $Q_2$ is connected to the gate of the FET $Q_4$ and is also connected to the ground through the FET $Q_3$. An output control signal CS is derived from the common junction $N_4$ between the FET's $Q_4$ and $Q_5$. To the gate of the FET $Q_1$ is applied the signal $\phi R_A$ through a node $N_2$, and to the gates of the FET's $Q_3$ and $Q_6$ is applied the signal $\phi X_1$ through a node $N_5$. In addition, the gate of the FET $Q_2$ is applied with the $\overline{CAS}$ signal via a node $N_3$.

As well be seen from FIGS. 6 and 8, the signal $\phi R_A$ is a signal which takes "1"-level after the $\overline{RAS}$ has been activated, and the signal $\phi X_1$ is a $\overline{RAS}$-synchronized signal which is opposite in phase to the signal $\phi R_A$ and which takes "0"-level at the moment when the column series timing circuit 311 and 312 could be activated. When both the $\overline{CAS}$ and the signal $\phi R_A$ take "0"-level, the output signal CS is turned to a high level and serves as an activation start signal for the column series timing signal generator circuits 311 and 312. Once the signal CS is turned to a high level, further change of the signal CS to "0"-level, that is, to an inactivated state is controlled solely by the signal $\phi X_1$. Namely, the signal CS of "1" level is maintained when the $\overline{RAS}$ is turned to the inactive level. This is due to the fact that the $\overline{CAS}$ is not directly input to the circuit for generating the output signal CS.

The second column series timing circuit 312 includes an AND gate $G_1$ to which the control signal CS is applied and also the $\overline{CAS}$ is applied at its inverting (NOT) input. The output of the AND gate $G_1$ is applied to one input of each of AND gates $G_2$ and $G_3$ via delay buffers $D_{10}$ and $D_{11}$, respectively. On the other hand, the output of the AND gate $G_1$ is output through an inverter $I_4$ as the signal $\phi_Z$, and also applied to the other input of each of the AND gates $G_2$ and $G_3$. The signals $\phi_S$ and $\phi_D$ are derived from the outputs of the AND gate $G_2$ and $G_3$, respectively.

Another preferred embodiment of the control circuit 350 is illustrated in FIG. 9. In this figure, component parts corresponding to those included in the control circuit shown in FIG. 8 are designated by like reference numerals. In this circuit construction, a boot-strap circuit consisting of FET's $Q_6$ to $Q_{10}$ is added to the construction shown in FIG. 8 to raise the high level of the signal CS up to the power supply $V_{DD}$ level.

Now an alternative embodiment of the present invention will be explained with reference to FIGS. 10 and 11. In this circuit arrangement, the timing signals $\phi R_A \sim \phi R_C$, $\phi C_1$, $\phi C_2$, $\phi_S$, $\phi_D$, $\phi X_1 \sim \phi X_3$, $\phi Y_1$, $\phi Y_2$ and $\phi_Z$ applied to the respective function circuits are identical to those shown in FIG. 6. Constructions of a row address inverter buffer 409 and a row address decoder 410 are basically identical to those in the first preferred embodiment shown in FIG. 5. While memory cell matrix 405 also has an M-row × N-column construction, the N columns therein are divided into a plurality of groups each consisting of L columns. A column selection circuit 422 includes N pairs of transfer gates which are divided into a plurality of groups each including L number of transfer gates. Each group of the L number of transfer gates are coupled to L pairs of input/output buses I/O$_1$, I/O$_1 \sim$I/O$_L$, I/O$_L$ at their outputs in accordance with an output of a first column decoder 401. In this structure, the column decoder 401 is adopted to select one of the transfer gate groups and thereby to transfer data on the L number of column of the selected group to the L pairs of input/output buses at the same time. An I/O selection circuit 430 select one pair of input/output buses among L pairs based on an output of a shift register having a L-bit shift length 420S. A second column decoder 402 D is associated to the shift register 402S for designating a shift start address as in the case of the above embodiment. The operation of the embodiment will be described in the following. In response to the signal $\phi C_1$, a column address inverter buffer 413 incorporates column address signals through address input terminals 408. Then a number of more significant bits 420 among the column address signals incorporated by the column address buffer 413 are applied to the column address decoder 401, which applies a selection signal to the column selection circuit 422. The column selection circuit 422 selects one of the groups each consisting of L columns of memory cells so as to couple the data in the selected L columns to L pairs of input/output data buses 414. On the other hand, a number of less significant bits 421 among the column address signals are applied to the second column decoder 402D. The second column decoder 402D causes a selection circuit 430 to select one bit in the shift register 402S having an L-bit outputs. The data corresponding to the selected one bit among the L-bits, are output through an input/output circuit 417.

A detailed structure of the column group selection decoder 402D, the shift register 402S and the selection circuit 430 in combination is illustrated in FIG. 11. This circuit arrangement operates so as to select one pair among L pairs of input/output buses I/O$_1$, I/O$_1 \sim$I/O$_L$, I/O$_L$ leading from the selection circuit 422 and to couple the selected pair to a pair of data buses DI/O, DI/O. The function of the shift register 402S itself is not different at all from that of the shift register 306 shown in FIGS. 5 and 7, and basically their operations are identical to each other. TFA and TFB in the selection circuit 430 denote transfer-gate transistors controlled by the output of the column group selection decoder 402D. In this circuit arrangement, there is provided an additional advantage that an access time in a page mode can be further shortened because the memory cell information has been already transferred to the L pairs of input/output buses in accordance with the column address information 420 taken in during the first RAS/CAS cycle and so in the subsequent consecutive access mode the data transfer time to the input/output buses becomes unnecessary.

I claim:

1. A memory device comprising a memory cell matrix including a plurality of memory cells arrayed in rows and columns, a set of address terminals, means for receiving a row strobe signal, means for receiving a column address strobe signal, row address means for operatively incorporating row address signals through said address terminals in response to active state of said row strobe signal, row selection means for operatively enabling selected one of said rows based on the incorporated row address signals in response to the active state of said row strobe signal, first column control means for operatively generating a first signal in response only to such an active state of said column address strobe signal that occurs at the first time after said row address strobe signal becomes active, second column control means for operatively generating a second signal in response to the respective active states of said column strobe signal under the active state of said row address strobe signal, column address means for operatively incorporating column address signals through said address terminals in response to said first signal, shift register means having a plurality of states whose outputs are adapted to select at least part of said columns of said memory cell matrix, and means for controlling shift operation of said shift register in response to said second signal.

2. The memory according to claim 1, further comprising a bus line, a plurality of transfer gates each coupled between associated column and said bus line.

3. The memory according to claim 2, further comprising an input/output circuit controlled by said second signal.

4. A memory device comprising memory cells arrayed in a matrix form of M rows and N columns (M and N having positive integers), a first terminal for receiving a first control signal, a second terminal for receiving a second control signal, a row decoder for selecting one of said M rows in response to presence of said first control signal, first control circuit for generating a third control signal in response to only first presence of said second control signal under the presence of said first control signal, second control circuit for generating a fourth control signal in response to the respective presence of said second control signal under the presence of said first control signal, a column decoder for selecting at least one of said N columns in response to said third control signal, a shift register having plurality of shift stages, each of outputs of said column decoder being associated with each of said shift stages, and control means for controlling shift operation of said shift register in response to said fourth control signal, wherein said shift register incorporates column address information provided by said column decoder in response to said third control signal and thereafter shift the incorporated address information to a different column address location in response to said fourth control signal.

5. The memory device according to claim 4, in which said first control circuit includes a first voltage terminal, a second voltage terminal, a first node, a second mode, a first field effect transistor coupled between said first voltage terminal and said first node, second field effect transistor coupled between said first node and said first voltage terminal, a third field effect transistor coupled between said first voltage terminal and said second node, a fourth field effect transistor coupled between said second node and said second voltage terminal, a fifth field effect transistor coupled between said first node and said second voltage terminal, circuit connection for connecting a gate of said third field effect transistor, a first control circuit for conducting said first field effect transistor when said first control signal is present, a second control circuit for conducting said fourth and fifth field effect transistors when said first control signal is absent and means for conducting said second field effect transistor in response to the presence of said second control signal, in which said third control signal is derived based on a level at said second node.

6. A memory device comprising a plurality of memory cells arrayed in a matrix of rows and columns, a first number of data lines, a row decoder for selecting one of said rows, a first column decoder for selecting first number of said columns to be connected to said first number of said data lines, an output line, a plurality of switching means coupled between said output line and said data lines, a second column decoder for selecting one of said switching means, a shift register arranged in parallel with said second column decoder, means for receiving a first signal for enabling said row decoder, means for receiving a second signal, first control means for enabling said first and second column decoders in response to first occurrence of said second signal after said first signal occurs, and second control means for performing shift operation of said shift register in response to the respective occurrence of said second signal after said first signal occurs, in which contents of memory cells on the selected first number of columns are serially read-out by operating said shift register.

7. A memory device comprising memory cells arrayed in row and columns, a row decoder for selecting one of said rows, a column decoder for deciding at least one of said columns to be selected, shift register composed of a plurality of shift stages each arranged in parallel with the associated output of said column decoder, means for receiving at least one control signal, first control means for operatively enabling shift operation of said shift register in response to said control signal after the states of said row and column decoders are established, and second control means for operatively suppressing subsequent operation of said column decoder when said shift register is enabled.

* * * * *

UNITED STATES PATENT AND TRADEMARK OFFICE
CERTIFICATE OF CORRECTION

PATENT NO. : 4,422,160

DATED : December 20, 1983

INVENTOR(S) : Hiroshi Watanabe

It is certified that error appears in the above-identified patent and that said Letters Patent is hereby corrected as shown below:

Column 2, line 23, after "with", insert -- a --.

Column 5, line 2, after "signal", insert -- $\overline{W}$ --.

Column 8, line 45, change "$\phi_2$" to -- $\phi C_2$ --.

Column 12, line 25, change "states" to -- stages --;
   line 49, after "having", insert -- a --.

Column 14, line 13, before "shift", insert -- a --.

Signed and Sealed this

Seventeenth Day of April 1984

[SEAL]

Attest:

GERALD J. MOSSINGHOFF

Attesting Officer

Commissioner of Patents and Trademarks